United States Patent [19]

Allen et al.

[11] Patent Number: 5,473,758
[45] Date of Patent: Dec. 5, 1995

[54] SYSTEM HAVING INPUT OUTPUT PINS SHIFTING BETWEEN PROGRAMMING MODE AND NORMAL MODE TO PROGRAM MEMORY WITHOUT DEDICATING INPUT OUTPUT PINS FOR PROGRAMMING MODE

[75] Inventors: Ray Allen, Mesa; Sumit Mitra, Tempe; Rodney Drake, Mesa, all of Ariz.

[73] Assignee: Microchip Technology Incorporated, Chandler, Ariz.

[21] Appl. No.: 938,911

[22] Filed: Aug. 31, 1992

[51] Int. Cl.$^6$ ................................................. G06F 15/02
[52] U.S. Cl. ..................... 395/430; 395/834; 364/232.9; 364/244.6; 364/716; 364/DIG. 1; 365/52
[58] Field of Search ................................... 395/275, 375, 395/500, 425, 800; 364/232.8, 232.9, 221.6, 244.6, 946.2, 946.9, 949.2, 965.76, 716; 307/465, 449, 450, 468; 365/52

[56] References Cited

U.S. PATENT DOCUMENTS

| | | | |
|---|---|---|---|
| 4,680,731 | 7/1987 | Izumi et al. | 364/200 |
| 4,785,425 | 11/1988 | Lavelle | 365/52 |
| 4,896,296 | 1/1990 | Turner et al. | 307/465 |
| 5,222,046 | 6/1993 | Kreifels et al. | 365/230.06 |
| 5,237,218 | 8/1993 | Josephson et al. | 307/465 |
| 5,276,839 | 1/1994 | Robb et al. | 395/425 |
| 5,336,951 | 8/1994 | Josephson et al. | 307/465 |

*Primary Examiner*—Thomas C. Lee
*Assistant Examiner*—Moustafa M. Meky
*Attorney, Agent, or Firm*—O'Connor Cavanagh

[57] ABSTRACT

A microcontroller and associated EPROM program memory are fabricated in a single semiconductor chip. The microcontroller device is adapted to be programmed using digital command words or other bit patterns applied as inputs after installation of the device in circuit with a system to be controlled by the device, and to have its programming pins isolated from the system to avoid effects on system operation while the programming is taking place. The in-circuit programming uses considerably less than the total number of input/output (I/O) pins of the device, which in total are fewer than the number of bits in a command word. This is achieved with a serial/parallel programming interface between the pins and the program memory, and by applying the data in serial fashion to the interface where it is latched and loaded in parallel in the memory. Input data to the device may alternatively be entered in parallel to the interface in bytes of width less than the total number of I/O pins of the device.

10 Claims, 1 Drawing Sheet

SYSTEM HAVING INPUT OUTPUT PINS SHIFTING BETWEEN PROGRAMMING MODE AND NORMAL MODE TO PROGRAM MEMORY WITHOUT DEDICATING INPUT OUTPUT PINS FOR PROGRAMMING MODE

BACKGROUND OF THE INVENTION

The present invention relates generally to semiconductor microprocessors, to a class of microprocessors known as microcontrollers which perform selective control functions, and more particularly to programmable microcontrollers which are adapted to be programmed in-system without adversely affecting the controlled system functions.

The evolution of microprocessors into complex instruments and machines has led to sophisticated, fast real-time control capability. Large microprocessors of 16 or 32 bit capability with associated interrupt handler chips, programmable timer chips, ROM and RAM chips, have been replaced in many control function instances by single chip microcontrollers with all peripherals embedded on the same chip with the microcontroller. Operation of the chip in an expanded mode enhances the versatility of all on-chip features. Microcontrollers are used in a wide diversity of present-day applications, with new applications found almost daily. In hand-held instruments such as tiny pocket-sized pagers, the microcontroller is responsive to received characters to interpret them, produce an audible signal to notify the user of an incoming message (or not if the user prefers an inaudible mode), and produce multiple messages among the several last of those received on a suitable display, typically an LCD. The microcontroller can also recall from its internal memory any or all of the messages received in a given period of time. Among its other instrumentation uses are those as meters and testers, capable of carrying out thousands of tests, each in a millisecond or less.

Other applications include keyboard controllers for personal computers, in which the microcontroller serves to offload many tasks formerly handled by the processor, including continuous performance of numerous diagnostic procedures and notification to the processor if a problem is detected. Among other personal computer applications, microcontrollers are used in modems for command interpretation and data transmission, in printer buffers for high speed dumping of data in preparation for driving the printer at the appropriate speed, or for color plotters, in color copiers, electronic typewriters, cable television terminal equipment, lawn sprinkling controllers, credit card phone equipment, automotive applications such as engine control modules, antilock braking systems, automobile suspension control for desired designation of ride softness or rigidity according to user preference, and a host of other applications daily by industrial and consumer customers.

A real time microcontroller provides rapid solutions to signal processing algorithms and other numerically intensive computations, controls events such as opening and closing of relays, the position and speed of a motor, and other control functions such as those mentioned above. The central processing unit (CPU) of the microcontroller operates in conjunction with certain peripherals to perform the control function, including devices such as timers, signal ports, and baud rate generators, among others.

The present invention is incorporated in an enhancement of an 8-bit user programmable reduced instruction set capability (RISC) microcontroller family manufactured and marketed by Microchip Technology Incorporated of Chandler, Ariz. (assignee of this application) as its PIC®16C5X family of CMOS (complementary metal-oxide-silicon) EPROM (electrically programmable read-only memory) -based microcontrollers. The enhanced user-programmable single chip device addresses the burgeoning number of embedded control applications requiring economical analog sensing and control applications. The PIC®16C5X utilizes, among other things, a 12 I/O (input/output) port configuration with 12-bit instruction words. The enhanced microcontroller in which the present invention is utilized retains the same 12 I/O pin configuration, in part for the sake of compatibility, but its instruction word length is increased to 14 bits.

It is a principal object of the present invention to provide apparatus and method which permits the use of 14-bit instruction words despite the presence of only 12 I/O ports in the microcontroller.

User programmability is a popular feature of the PIC16C5X family of microcontroller devices, and it is another broad object of the present invention to enhance that feature by providing the new device with in-system programmability, by which the device may be user-programmed while it is actually embedded in a system to be controlled.

The significance of in-system or in-circuit programmability may be explained as follows. Most programmable semiconductor integrated circuit devices are programmed while residing outside the system in which they will operate, i.e., typically before they are plugged or soldered into the system circuit board. In contrast, the present invention provides a technique and implementation whereby the packaged integrated circuit microcontroller chip with on chip program memory may be soldered or plugged into the system which it is intended to control, and afterward programmed in whatever manner the user desires within the constraints imposed by the device itself.

This capability is especially important in a number of control applications. One example is in a steering wheel control, where typically, after the system board containing the microcontroller device is assembled and plugged into the electronics of the automobile, a final adjustment is required to be performed owing to the slight difference in handling characteristics between every car coming off the production line. Through testing performed by the device user (the automobile manufacturer), a set of parameters may be developed to be programmed into the device as this final adjustment. Clearly, that could not be accomplished prior to completion of the system which is embedded in the steering wheel assembly. Nor is it feasible to build the system on-site with the necessary final adjustments made in place, without the use of in-circuit or in-system programming. The advantage of the latter is that fine tuning of a particular adjustment, or, more broadly, matching of a set of parameters to a variable target, can be customized at the time the device, system or circuit to be controlled is in its final phase(s) of manufacture or assembly. It is not necessary, and, with reference to the above example, the required information may not even be known, to perform final adjustments (by way of programming) on the microcontroller device at the factory where it is fabricated, prior to assembly of the microcontroller into the system to be controlled. Thus, a typical requirement of in-system programming exists where a controllable system is already constructed—or very nearly so—and performs the general function, but lacks customization.

In-system programming per se is not new, in that certain prior art semiconductor devices such as PLDs (programmable logic devices) have heretofore had limited in-system programming capabilities. However, although such in-system programmability exists, the programming mode of the PLD is not an operating mode but, rather, another and different mode of operation. After it is programmed, the PLD circuit must be operated in its normal operating mode, and, to that end, two or more additional pin-outs have been added to the device for clock, data or other lines, to get information in and out of the device. This adds to device complexity and size.

Therefore, another object of the invention is to provide a semiconductor device which may be programmed while in circuit without the need for additional pins relative to those utilized for the normal circuit or system operating mode.

A further object of the invention is to provide a microcontroller device which may be user-programmed while embedded in the system which is to undergo control.

Typically, the prior art devices that are programmable in-system, such as PLDs and like devices, are based on EEPROM technology, which is inherently designed to be programmed, being electrically readable and writable, while in-system. According to a feature of the present invention, however, an EPROM-based microcontroller is provided with in-system programmability. In the latter case, the device requires larger voltages on the pins, which presents more complex issues to in-system programmability.

SUMMARY OF THE INVENTION

Briefly, the present invention resides in part in a device which is adapted for in-system programmability (alternatively referred to at times herein as "in-circuit programmability", both terms being applicable and interchangeable) in a way that allows it to be entered into the programming mode while still being allowed to operate in its normal operating mode, and without need for one or more extra pins. This is particularly important where it is desired to maintain compatibility with previous similar products having that same pin configuration—and avoiding the use of two, three, or more extra pins to provide the functionality. The objective is achieved in part by multiplexing a small number of existing I/O pins on the device package between a first programming mode and a second operating mode. In a preferred embodiment of the invention, only three existing pins—a clock pin, a data pin, and a master clear pin (aside from power pins)—are utilized to force the device into the programming mode.

The technique employed according to the invention accomplishes the in-system programming while the controlled system is not in its normal operating mode. Whether the system is or is not powered up is of no consequence, since only the microcontroller device itself need be powered up for programming. In any event, the controlled system is not in any way adversely affected by the in-system programming.

Typically, prior to assembly of a programmable device into a system board, at least a portion of the memory array would be programmed—the size of the portion depending upon the number of parameters desired to be programmed into the memory. To perform such programming, most EPROM-based programmers input the data in parallel, followed by exciting a control to perform writing of the data through application of a programming voltage of the appropriate level, then reading it back for verification, and continuing this process until the programming is completed for all locations. To do that—to provide parallel excitation of the device—it is necessary to have access at that moment to all I/O pins of the device.

However, when the device has been embedded into a larger system, those pins are connected elsewhere, to other parts of the overall circuit, and it is highly desirable to avoid any disturbance of the system during the time that the device is being programmed. The programming inputs of the device may be clamped, and then external electrical signals applied to those inputs to force programming of the device as it resides assembled in the board. The greater the number of pins involved in the programming, the less feasible it is to accomplish the programming with minimal disturbance to other portions of the system.

According to another feature of the invention, not only is the number of pins required for programming kept relatively small, but the programmable device is adapted to permit electrical isolation of the programming pins from the other portions of the controlled system in a simple yet highly effective manner, either by means introduced by the user as part of the programming operation, or by components provided in association with the pins on the device itself. In the presently preferred embodiment, the isolation is performed by the user by simply inserting a resistance in each system path to a programming pin, but appropriate resistance or impedance elements may be implemented in association with the serial programming pins in a straightforward manner and with the only disadvantage being some additional complexity.

According to another significant aspect of the invention, the microcontroller is provided with a serial-parallel programming interface between the I/O ports and the program memory, to allow both serial and parallel programming of the device. This takes on special importance in a case where the number of bits in the instruction or command word is greater than the number of I/O ports of the device.

The programming interface on prior art microcontrollers, including those of the PIC16C5X family, employ a parallel mechanism only, which precludes any capability for serial in-circuit programming. The special interface provided by the present invention not only allows in-circuit programmability of the device, but provides a mechanism for programming the 14-bit instruction or command word with only 12 I/O ports. Programming of the microcontroller in a serial fashion is achieved through the aforementioned control of only three data pins (clock, data and clear) and the device power pins ($V_{DD}$ and $V_{SS}$), which provides sufficient flexibility for the in-circuit programming. A parallel programming mode may be used, but requires the use of all 12 of the I/O pins (the two pins that were used as clock and data during serial programming are used to control the interface), making it cumbersome for in-system programming. However, operation of the programming interface in parallel fashion increases the programming speed, which is useful for production-type vector testers, such as those testers marketed under the trademark Sentry.

As noted above, various circuits (including simple resistances) are readily implemented by the user to isolate the controlled system components from the microcontroller while the in-circuit programming is being performed.

A related issue involved in such a situation is the need to determine how to get the wider instruction word through a smaller number of pins. The provision of a serial-parallel program interface enables the in-circuit programmability, as well as the capability to program large memory sizes using only relatively few pins on a small package.

The parallel input/output aspect permitted by the technique of the invention is important because of the number of test vectors that must be employed during testing. If the device were restricted to serial testing, the number of vectors would require inordinate test time, whereas the parallel capability allows a substantial reduction. Thus, not only does the invention allow a user to program using only three pins of the device, but it also allows testing or third party programming to be accomplished considerably faster or with a vastly reduced amount of data to be in file for programming, by use of the parallel interface. Both serial and parallel interfaces are available to the user. The interface latch itself may be conventional, comprising, for example, a pair of shift registers and some decode logic.

In the presently preferred embodiment, the microcontroller program interface initially accepts data and outputs data in serial fashion because the device is initialized to be in the serial mode. It is switchable into the parallel mode, to accept data and provide data in a parallel fashion, by executing a specific command. Once the parallel mode is entered, it is necessary to completely exit the programming mode in order to get back to the serial mode.

The principles of the invention are not limited to microcontrollers alone although that is its preferred application. Furthermore, the issues to be resolved do not arise solely because of a desire to maintain compatibility with a previously marketed device. On the contrary, in-system programmability has utility in a considerable number of products and product applications. For example, it may be desirable to customize a product in the final testing phase of the system. Another more specific example of customization is where a remote control for a car alarm or car door opener system is to be personalized for every different customer. If the customer loses the remote control and seeks a replacement, the dealer simply obtains a new one from inventory which is a complete system in all respects and fully tested, but in which the "key" has been left blank to be programmed at a later time. Then, using a programmer device incorporating the principles of the invention, the dealer may readily perform in-system programming to personalize the remote control device for the particular customer. The control device is programmed while it is embedded in the system to provide at least some of the memory locations with customizing.

Microcontrollers employing the principles of the invention have significant utility in applications ranging from high speed automotive and appliance motor control to low power remote sensors, pointing devices, and telecommunications processors. The EPROM-based technology employed in the preferred embodiment enables extremely fast and convenient customization of application programs, such as transmitter codes, motor speeds, receiver frequencies, and so forth.

A variety of packaging options for the device enables selection of programming techniques suitable for various user applications. For example, the device may be assembled in a windowed ceramic package to permit UV (ultraviolet radiation) erasability for iterative programming desirable for prototype development and pilot series. In contrast, plastic packaging renders the device one-time programmable (OTP), which enables the user to program the program memory only once (in addition to other programmable functions such as oscillator fuses and configuration fuses, which are outside the scope of the present discussion), but provides a less expensive configuration and inventory capability particularly suited for users that anticipate frequent code changes and updates. A variation of the OTP device enables supplying quick-turnaround production (QTP) devices principally by factory programming of all EPROM locations (and fuse options) of the OTP version, which is ideal for the user that chooses the efficiencies of factory programming for medium to large quantities of devices and has the luxury of stabilized code patterns.

BRIEF DESCRIPTION OF THE DRAWINGS

The above and still further objects, features, aspect and attendant advantages of the invention will become apparent from a consideration of the following detailed description of the best mode of carrying out the invention as presently contemplated, taken in conjunction with the accompanying drawings in which.

DETAILED DESCRIPTION OF THE PREFERRED EMBODIMENT AND METHOD

Figure 1:
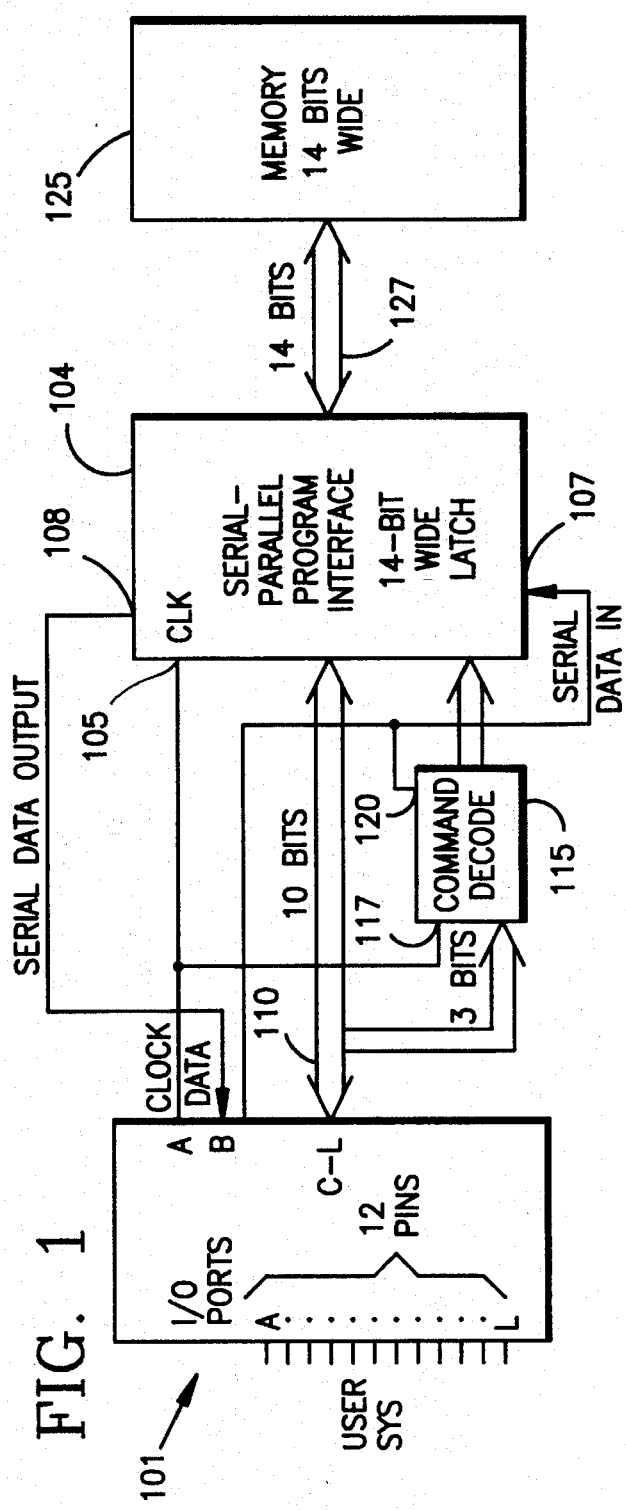
FIG. 1 is a simplified block diagram of a presently preferred embodiment of the invention.

FIG. 1 is a block diagram of the relevant portion of a semiconductor programmable microcontroller device having a plurality of I/O ports 101 which, in this embodiment, includes twelve I/O pins labeled A–L. Inputs to and outputs from these I/O pins are accepted from and applied to the user system, an exemplary type of which will be described below in connection with the description of FIG. 2. Ports A and B are designated clock and data pins which are used in the serial programming of the device as will be described presently. Ports C–L are arranged and adapted to transfer 10-bit words (one byte) to and/or from a serial/parallel programming interface 104. The interface is a latch arranged and adapted to selectively accept serial or parallel data, and may comprise a shift register and appropriate decode logic which is well within the skill of the art and need not be described in any further detail.

Interface 104 has a terminal 105 for a clock line from port A of the I/O ports 101, and input and output terminals 107, 108 for accepting and dispatching serial data from and to port B. Additionally, bus 110 permit entry and exit of data words (which may include command words) in parallel fashion from and to I/O ports C–L. A command decode shift register 115 has clock and data inputs 117 and 120 from ports A and B.

EPROM program memory 125 is adapted to be written to and read from by programming interface 104. The memory is organized as 8K×14 (14 bits wide) program memory space.

The microcontroller is structured and adapted to accept 14 bit instruction words with only 12 I/O ports. The existing PIC16C5X microcontroller family uses 12 bit words and a like number of I/O pins, and the use of a similar pin configuration here maintains desirable compatibility of the present device with that family of microcontrollers. The 14 bit instruction word, however, achieves a level of functionality and addressability not available with a 12 bit word, because the latter will only allow so many locations to be addressed, which is clearly less than the number that may be addressed with 14 bits.

Although the use of 14 bit words was an accommodation to necessity taking into consideration the design objectives, functions and applications of the device, it created the problem that 14 bits of information are to be fed to program a location in EPROM program memory 125 on the microcontroller chip while having only 12 I/O pins available to do that. It is the serial/parallel program interface 104, together with multimode (switchable or multiplexed) clock and data pins to serially transmit data into the device, for internal latching by interface 104 which enables the capability to use a 14 bit instruction word with only 12 I/O pins. The 14 bit wide word, or more broadly, bit pattern, is then used to program the EPROM by parallel application from interface 104 into the memory. The transmission of data from the external world into the device, however, is accomplished in serial fashion utilizing only two (ports A and B) of the 12 possible lines on which to transmit. The parallel capability provides faster programming time and test time. For testing purposes, a pseudo parallel mode is available that allows two bytes of data to be entered, of ten bits per byte, but using, in this particular example, only fourteen of the twenty possible bits. Since two 10-bit parallel bytes of data are entered one byte at a time or serially, the mode is referred to as pseudo parallel or serial-parallel.

Effectively, the 14-bit wide interface 104 is an internal latch which is provided to permit data to be entered either serially or in parallel for programming the device, and in either instance the device itself does not care that only 12 I/O pins were available. Once the data is entered, it may be programmed or read back, but whether the problem is one of accepting more than 12 bits of data or retrieving more than 12 bits of data with only 12 I/O pins, the use of an internal latch which permits serial and parallel entry and readout resolves both. Readout of the data may be accomplished in serial or in pseudo parallel fashion.

In operation of the device of FIG. 1, initially the pins associated with clock, data, and master clear, which together with two power pins ($V_{DD}$ and $V_{SS}$) are the only ones used for the in-system programming, are set for accepting data in serial fashion. The device is actually an 18 pin part, but if the power, ground, clock and reset lines are ignored for present purposes, only twelve pins are left for data. Because of the architecture and the need for higher performance, higher memory addressing, 14-bit wide memory 125 is used to accommodate the 14-bit wide operating codes or instructions. As described above, the resulting problem of getting 14 bits of data through a 12-bit path is solved by inserting serial programming interface 104 to accept data from the I/O pins, latch it in, and program the memory. A serial transfer is effected using the clock line at port A and a data line at port B. The clock serially shifts the data in one side (107) of the latch 104, or shifts the data out the other side (108), acting simply as a 14-bit wide shift latch. In this way, all 14 bits are shifted into this latch.

To perform the various commands, such as reading a location or programming, the data is entered, either serially or in parallel, into a 3-bit latch 115 which, along with some decode logic, controls the operation of the 14-bit shift register. In serial mode, the device recognizes that the first six clock pulses are for the commands. However, only three of those data bits are loaded into the command shift register. The first pulse is a start pulse, pulses 2–4 are for data, pulse 5 is an execution pulse, and pulse 6 is either a stop pulse or a "don't care" pulse. If the instruction calls for bringing data into the programming interface latch 104, the remaining bits in the data stream are serially shifted into that latch. Another command is then entered to initiate programming the EPROM memory 125. When that command is decoded, all fourteen bits in the latch are written in parallel into the memory. For a read instruction, the fourteen bits are read in parallel out of the memory into latch 104, and then serially shifted out therefrom along the data path (serial data out) on 108.

Dual modes are available for pins RB6 and RB7 (FIG. 2), which may be switched between programming modes, from clock and data for the serial mode, to hi/lo byte and command/data select for the parallel mode, respectively.

The invention further takes advantage of the capability to program the device using considerably less than all of the available pins—in this embodiment, only three pins—while powering down the supply to the chip (or circuit board). For this purpose, the clock and data pins are classified as two data pins. The third pin is the master clear input—or reset input—to the device, and is also used as the programming voltage input to the device. Knowing that only three pins are to be excited when the part is actually installed (e.g., soldered or plugged) into the circuit board of the system intended to be controlled by the microcontroller, makes it a simple matter according to the invention to isolate those pins from the rest of the board. Resistors may be hard-wired or arranged for switching into the board, for example, for that purpose. Then, when the device is platformed to excite those pins for purposes of the in-system programming, the rest of the system will not be affected, at least in any material way.

Figure 2:
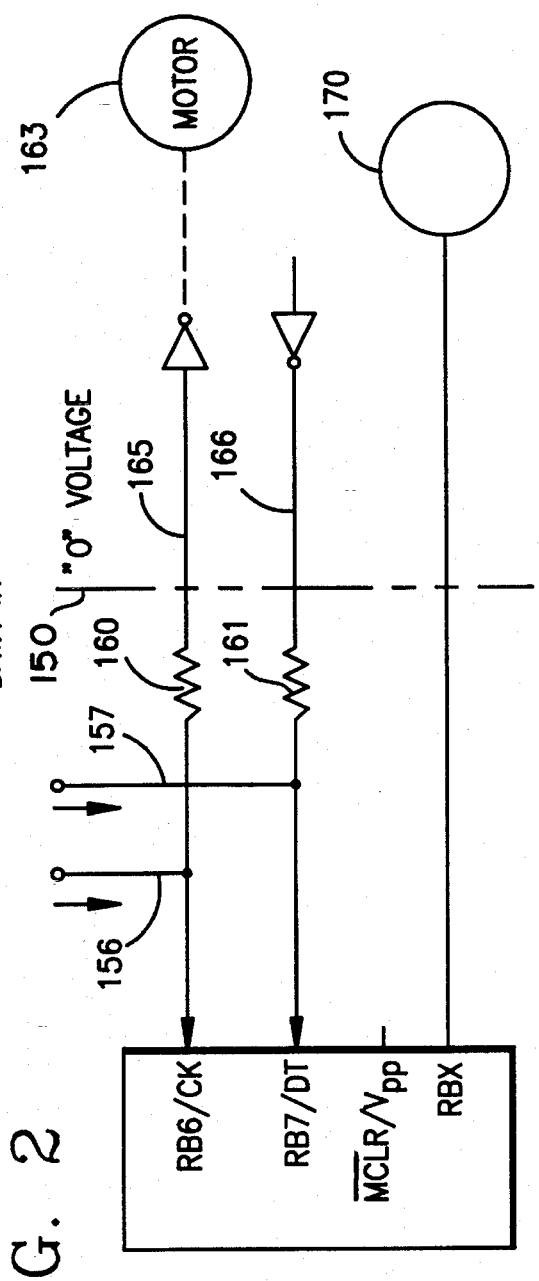
FIG. 2 is a simplified block diagram illustrating the use of user-implemented isolation circuitry during in-system programming of the device of FIG. 1.

In the preferred embodiment and method, the actual isolation circuitry (which, again, may simply be resistors) is user implemented. Referring to FIG. 2, the device is to the viewer's left of the phantom line 150, and the system being controlled is to the right of that line. The pins to be used in the in-system programming are brought in on ports which include RB6/CK (clock) and RB7/DT (data), both of which are set for serial programming. A test mode is entered by holding these two serial pins (clock and data) at 0 level while raising the level on the MCLR (master clear)/$V_{PP}$ pin from 0 to 12.5 V. Each of these pins is also a regular I/O pin of the device in normal operation, so each has a dual function. The MCLR/$V_{PP}$ pin is also dual-function. In normal operation, one of these I/O pins may be used as an output, such as for driving other circuitry within the controlled system. Another may be an input from other circuitry.

When in-system programming is to be performed, the device is clamped onto and signals are forced on pins RB6/CK and RB7/DT via lines 156 and 157. As this is being done, the programming voltage may be fighting against some other driver of the system which is seeking to force a different voltage onto the same pin. According to this aspect of the invention, electrical isolation of the programming pins and voltages from the system (and vice versa) is achieved by connecting a resistor of appropriate value in each affected path, such as 160 and 161. This connection is made to the respective pins by the user before initiating the in-system programming, and then removed. Alternatively, resistance devices might be supplied on the applicable pin-outs of the device. In any event, the suitable arrangement is characterized in the appended claims as means adapted for enabling isolation, which also encompasses a bare pin where such isolation for in-system programming is intended or recommended.

The effect is to force the required programming voltage onto the device side to the left of line 150, through an effective, yet simple isolation technique which keeps the system side from being affected (and vice versa). It may happen that pin RB6/CK is also driving a motor 163, for example, within the controlled system. It would be undesirable in these circumstances for a voltage to appear at point 165, so it would be appropriate in addition to forcing the two pins RB6/CK and RB7/DT, when clamping on the system, to also force point 165 to zero voltage. The resistors will isolate these points (165 and 166) and not affect the rest of the system as the programming voltages are being applied for in-circuit programming of the microcontroller device.

This isolation technique could become complex if, instead of two or three pins, it were necessary to connect electrical resistances or other isolation circuitry for twelve pins. However, with but a few pins involved the isolation is achieved quickly, and precludes any materially adverse effect on the performance of the system while the in-circuit programming is taking place. After the programming is completed, the isolation means is removed.

By way of further example, if in another portion of the system a different device 170 is being driven, and the insertion of a resistor in that line would be unacceptable because a very high speed signal is involved, or for some other reason, then a satisfactory solution is simply to drive that device with a different I/O pin, such as $RB_X$. Hence, in virtual every instance an acceptable solution is available to avoid measurable or significant impact on the system.

Although a presently preferred embodiment of the invention has been illustrated and described in the foregoing specification, it will be apparent to those skilled in the relevant field that variations and modifications may readily be implemented without departing from the true spirit and scope of the invention. Accordingly, it is intended that the invention should be limited only by the appended claims and the pertinent rules of applicable law.

What is claimed is:

1. A device implemented to be programmed in accordance with instruction words entered as digital bits after installation of the device in circuit with a system to be controlled by the device, comprising:

a microcontroller for controlling the system, a programmable memory for the microcontroller, means responsive to instruction words entered into the device for programming the memory while the device is installed in circuit with the system to be controlled, including means for enabling suppression of perturbations of the system which would otherwise occur during in-circuit programming so as to avoid effects on system operation while the programming is taking place;

a plurality of input/output (I/O) pins for receiving data including instruction words to be entered into the device, the number of I/O pins being smaller than the number of bits in an instruction word wherein at least some of said I/O pins are dual function and are shifted between a programming mode and a normal mode; and mode selection means associated with said at least some of the I/O pins but less than all of the I/O pins, for selectively enabling said at least some of the I/O pins to additionally function to receive data serially when in said programming mode for purposes of programming the memory while the other I/O pins are adapted to receive data in parallel thereby eliminating the need for dedicated programming I/O pins.

2. The device of claim 1, wherein:

the suppression enabling means includes impedance means for isolating the system and its operation from the instruction words being entered into the device.

3. The device of claim 1, wherein:

the programming means includes a data latch for receiving and retaining digital data including instruction words entered into the latch in either serial fashion or parallel fashion, or in a combination of both.

4. The device of claim 3, wherein:

the data latch has a bit capacity consistent with the width of instruction words and greater than the number of said plurality of input/output pins.

5. The device of claim 4, further including:

means for entering data received on the input/output pins into the data latch either serially or in parallel or both, to accommodate all of the bits in an instruction word despite the smaller number of input/output pins.

6. The device of claim 5, further including:

intermediate data storage means coupled between the input/output pins and the data latch for temporarily holding data to be entered into the data latch.

7. The device of claim 1, wherein:

the programmable memory is an EPROM.

8. A programmable semiconductor microcontroller chip for installing into and to control an electrically operated system, comprising:

a plurality of input/output (I/O) pins for receiving instruction words and data entered in the form of electrical signals to be processed by the microcontroller chip, the total number of said I/O pins is less than the number of bits in an instruction word, an on-chip programmable memory adapted to be programmed by instruction words received as inputs to the microcontroller chip at the (I/O) pins, means for selectively implementing electrical isolation of at least some of the I/O pins from the system to be controlled by the microcontroller chip, to suppress disturbances to the system when the memory is being programmed with the microcontroller chip installed in the system; and interface means for selectively responding to instruction words entered via at least some of said I/O pins in either serial or parallel fashion to program the programmable memory wherein said at least some of said I/O pins are dual function for shifting the chip between a programming mode and a normal mode, such that during said programming mode said at least some of said I/O pins are used to program said on-chip programming memory and during said normal mode said at least some of said I/O pins are used for inputting and outputting data appropriate for implementing control of the system in which the microcontroller chip is installed, thereby eliminating the need for dedicated programming I/O pins.

9. The invention of claim 8, wherein:

the programmable memory is an EPROM.

10. A method of programming a programmable microcontroller for installing into and for controlling an electrically operated system, while the microcontroller is installed within the system, the microcontroller having a plurality of input ports, the method comprising the steps of:

selecting at least some of the input ports for performing a dual function according to whether the microcontroller is operating in a normal mode or a programming mode and thereby eliminating the need for dedicated programming pins, using said at least some of the input ports for receiving instruction words to be entered in the microcontroller while in said normal mode, the number of input ports being smaller than the number of bits in an instruction word using said at least some of the input ports for receiving data serially to be used to program the microcontroller while in said program mode; and, substantially isolating electrical levels associated with programming the microcontroller from the circuit of the system to be controlled, with the microcontroller installed in circuit with the system, to preclude disturbances to the system during the in-system programming.

* * * * *